United States Patent [19]

Shinozaki et al.

[11] 4,388,399
[45] Jun. 14, 1983

[54] LIGHT-SENSITIVE IMAGE-FORMING MATERIAL

[75] Inventors: Fumiaki Shinozaki; Tomizo Namiki, both of Asaka; Tomoaki Ikeda, Shizuoka, all of Japan

[73] Assignee: Fuji Photo Film Co., Ltd., Kanagawa, Japan

[21] Appl. No.: 347,620

[22] Filed: Feb. 10, 1982

Related U.S. Application Data

[63] Continuation of Ser. No. 181,558, Aug. 27, 1980, abandoned.

[30] Foreign Application Priority Data

Aug. 28, 1979 [JP]   Japan .................................. 54-109417

[51] Int. Cl.$^3$ ................................................. G03C 1/76
[52] U.S. Cl. .................................... 430/271; 430/155; 430/160
[58] Field of Search ............... 430/271, 160, 155, 325, 430/326, 161

[56] References Cited

U.S. PATENT DOCUMENTS 4,232,105   11/1980   Shinohara ........................... 430/155

FOREIGN PATENT DOCUMENTS 2831101   1/1979   Fed. Rep. of Germany ...... 430/271

Primary Examiner—Won H. Louie, Jr.
Attorney, Agent, or Firm—Sughrue, Mion, Zinn, Macpeak & Seas

[57] ABSTRACT

A light-sensitive image-forming material which comprises a support having provided thereon a first layer comprising at least one alcohol-soluble polyamide resin and, on said first layer, a second layer comprising a light-sensitive photoresist composition, said layer containing said alcohol-soluble polyamide resin containing one or more polymers having one or more of a free carboxy group(s), one or more of a phenolic hydroxy group(s) or a maleic anhydride group in a proportion of about 0.1:9.9 to 6:4 by weight to said polyamide resin.

6 Claims, No Drawings

LIGHT-SENSITIVE IMAGE-FORMING MATERIAL

This is a continuation of application Ser. No. 181,558, filed Aug. 27, 1980, abandoned.

BACKGROUND OF THE INVENTION

1. Field of the Invention

This invention relates to an improved light-sensitive image-forming material, more particularly, to a light-sensitive image-forming material which can be rapidly processed without danger of toxicity or fire and to a process for forming images using the light-sensitive image-forming material.

2. Description of the Prior Art

As an image-forming process for producing a master for making maps or plate making or for producing light-sensitive peel-mask film for use in plate making, there has heretofore been known a process which comprises exposing a light-sensitive material comprising a transparent support having provided thereon, in sequence, an alcohol-soluble polyamide layer and a light-sensitive photoresist layer and, after development-processing, etching the material with an alcohol, e.g., methanol.

To reduce the toxicity problems with methanol used as an etching solution, aqueous solutions of sodium salicylate, chloral hydrate or bromal hydrate [Japanese Patent Publication No. 45321/74 (corresponding to U.S. Pat. No. 3,645,732 and DT-OS No. 2,023,083)] and an aqueous solution containing sodium p-toluenesulfonate and a lower alcohol (Japanese Patent Application (OPI) No. 116303/77) (the term "OPI" as used herein refers to a "published unexamined Japanese patent application") have been proposed as etchants.

However, in any of these processes the light-sensitive layer is first developed after irradiation with actinic light and, after washing with water, the alcohol-soluble polyamide layer is etched using the light-sensitive layer as a resist. Thus, such processes are very complicated.

SUMMARY OF THE INVENTION

This invention relates to a light-sensitive image-forming material which avoids the complexity of the above prior art processes and to an image-forming process using the material.

According to this invention, the steps of development, washing and drying, etching, and washing and drying, which are conducted after irradiation with actinic light are greatly shortened, with development and etching being conducted at the same time. The light-sensitive image-forming material which enables one to simultaneously develop and etch and the image-forming process using the material are as follows.

One aspect of the present invention relates to a light-sensitive image-forming material which comprises a support having provided thereon a first layer containing at least one alcohol-soluble polyamide resin as a necessary ingredient and, on said first layer, a second layer comprising a light-sensitive photoresist composition, the layer containing at least one alcohol-soluble polyamide as a necessary ingredient containing at least one polymer substance having one or more of a free carboxyl group(s) or one or more of a phenolic hydroxy group(s) per constitutional repeating unit, respectively, or a maleic anhydride group in a proportion of 0.1:9.9 to 6:4 by weight to said polyamide resin. In the specification and claims for brevity the alcohol-soluble polyamide, etc., except for the maleic anhydride group are merely referred to in the singular.

A further aspect of the invention relates to an image-forming process which comprises imagewise exposing the light-sensitive image-forming material using actinic light and then development processing the exposed material with an alkaline aqueous developer to thereby simultaneously develop and etch the light-sensitive photoresist layer and the first layer in one bath.

DETAILED DESCRIPTION OF THE INVENTION

Where the layer containing the alcohol-soluble polyamide as a necessary ingredient contains a colored material having a high optical density against visible light and/or near-ultraviolet light, the image-forming material of the present invention provides contrasty images while when the polyamide layer is provided on a transparent support and contains a material which does not transmit visible light and/or near-ultraviolet light (actinic radiation), it yields transparent image portions. Thus, the elements of the invention are useful as lithographic plates, as masters for photo-engraving for printing maps or for making printing plates.

The alcohol-soluble polyamide used in the present invention is extremely durable and has high adhesive strength (sufficient adhesion strength so as to not be delaminated from a support in ordinary handling), and therefore self-supporting properties can be provided with a relatively thin layer thereof (1 to 20 $\mu$m).

On the other hand, when the polyamide is provided on a support (for example, a polyethylene terephthalate film having a smooth, glossy surface), the first layer (alcohol-soluble polyamide layer) can be easily delaminated from the surface of the support by inserting a pin or sharp knife edge into one end of the image and applying a strong force to the thus formed space.

The relative inertness of the alcohol-soluble polyamide to the effects of solvents enable the photoresist layer to be applied thereto as a solution or dispersion in an aqueous, aliphatic or aromatic solvent, such as methanol, ethanol, benzene, toluene, etc.

As the support used in the present invention, there can be illustrated films of polyester (e.g., polyethylene terephthalate, etc.), polycarbonate, cellulose acetate, etc., paper, glass plate, aluminum plate, and the like. The thickness of the support is in the range of about 50 $\mu$m to 2 mm, preferably 80 $\mu$m to 0.5 mm.

Suitable examples of alcohol-soluble polyamides which can be used in this invention are those described in H. F. Mark, N. G. Gaylord and N. M. Bikales, Ed., *Encyclopedia of Polymer Science and Technology*, Vol. 10, pp. 463–464 (1969) ("Soluble Polyamide Polymers" in the section entitled "Polyamide Plastics"), John Wiley & Sons, Inc., New York; those described in Osamu Fukumoto Ed., *Plastics Zairyo Koza*, Vol. 16, pp. 33–35 (1970) ("Alcohol Soluble Nylons" in the section entitled "Polyamide Resins"), Nikkan Kogyo Shinbun K.K., Tokyo; Those described in British Pat. No. 795,961 or U.S. Pat. No. 3,081,168; those described in J. Kosar, *Light-Sensitive Systems*, p. 165 (1965), John Wiley & Sons, Inc., New York; those described in *J. Appl. Phys.*, Vol. 33, pp. 2914–2915 (1962); those described in *Photo. Sci. Eng.*, Vol. 7, pp. 238–240 (1963); etc. Specific examples of alcohol-soluble polyamides include nylon 6/66/610 (terpolycondensate), $\epsilon$-caprolactam/hexamethylenediamine/adipic acid/bis(4-aminocyclohexyl)methane quaternary polycondensate, polycondensate composed mainly of caprolactam, hexamethylenediamine/adipic acid and p,p'-diaminodicyclohexylmethane/adipic acid, N-methoxymethyl nylon, N-ethoxymethyl nylon, etc. Typically nylons soluble in methanol at 25° C. to an extent of a concentration greater than about 0.1% by weight can be used.

As specific examples of polymers combined with the alcohol-soluble polyamide resin (which have a solubility of 0.1 g or more in a solvent containing, as a major component, at least 50% methanol) which have a free carboxy group, a phenolic hydroxy group or a maleic anhydride group, and which are soluble in an aqueous alkaline solution, i.e., polymers containing a free carboxy group-containing divalent group, a phenolic hydroxy group-containing divalent group or a 2,5-dioxo-1-oxoran-3,4-diyl group as constitutional repeating units, there can be given (meth)acrylic acid/alkyl (meth)acrylate copolymers such as (meth)acrylic acid/methyl (meth)acrylate copolymers; copolymers of (meth)acrylic acid and benzyl methacrylate [the term "(meth)acrylic acid" means "acrylic acid or methacrylic acid"]; cellulose derivatives containing an added carboxy group-containing moiety such as hydroxypropyl-methyl cellulose hexahydrophthalate (or hydroxymethyl-methyl cellulose phthalate); phenol resins; (halogenated) polyhydroxystyrene; styrene/maleic anhydride copolymers; (meth)acrylic acid/styrene copolymers; (meth)acrylic acid/hydroxyalkyl (meth)acrylate copolymers; etc., though these are not limitative. Suitable examples of alkaline materials which can be used for the aqueous alkali solution include sodium hydroxide, potassium hydroxide, sodium tertiary phosphate, disodium hydrogenphosphate, potassium tertiary phosphate, dipotassium hydrogenphosphate, sodium silicate, potassium silicate, etc. The alkalinity of the aqueous alkaline solution is generally pH 10 to 14, preferably pH 11 to 13.5.

These alkali-soluble polymeric substances can be incorporated in the alcohol-soluble polyamide layer in a proportion of about 0.1:9.9 to 7:3 by weight to the alcohol-soluble polyamide.

The polyamide layer is usually about 1 to 20 μm, preferably 2 to 10 μm, in thickness.

A colorant such as a dye or a pigment may be incorporated in the layer containing the alcohol-soluble polyamide for the purpose of forming a contrasty image. The colorant which is incorporated in the alcohol-soluble polyamide layer should preferably be used in an amount such that a transmission optical density of not less than about 1.5, preferably not less than 2.0, most preferably not less than 3.0 is obtained for actinic radiation such as electromagnetic radiation of a wavelength of from about 290 nm to 550 nm. A suitable amount of the colorant ranges from about 1 to 40% by weight, and more preferably from about 2 to about 30% by weight, of the total weight of the alcohol-soluble polyamide layer.

Some specific examples of colorants suitable for use in the present invention are as follows:
CI Solvent Red 8 (C.I. #12715)
CI Solvent Yellow 19 (C.I. #13900:1)
Oil Yellow S (C.I. #1020)
Oil Yellow S-7 (C.I. #11390)
Oil Yellow #55 (C.I. #12700)
Oil Orange #145 (C.I. #12055)
Oil Orange SS (C.I. #12100)
Zapon Fast Orange G (C.I. #18745A)
Kayalon Fast Yellow 4R (C.I. #26090)
Kayalon Fast Yellow YL (C.I. #10338)
Kayalon Fast Orange GR (C.I. #11005)
Suminol Fast Yellow R conc. (C.I. #18835)
Suminol Fast Yellow 2GP (C.I. #18900)
Kayaku Acid Orange II (C.I. #15510)
Kayaku Acid Orange RO (C.I. #15575)
Direct Pure Yellow 5G (C.I. #13920)
Direct Fast Yellow GL (C.I. #29000)
Direct Fast Yellow R (C.I. #29025)
Daiwa Tartrazine (C.I. #19140)
Sumitomo Fast Yellow 4GL (C.I. #18965)
Suminol Fast Orange PO (C.I. #16240)
Sumitomo Acrydine Orange NO; RK conc. (C.I. #46005)
Direct Fast Orange S (C.I. #29150)
Sumilight Orange G conc. (C.I. #29050)
Direct Fast Scarlet 4BS (C.I. #29160)
Sumilight Red F 3B (C.I. #35780)
Sumilight Red 4B (C.I. #28160)
Suminol Fast Red B conc. (C.I. #14680)
Brilliant Scarlet 3R conc. (C.I. #16255)
Direct Sky Blue 6B (C.I. #24410)
Direct Blue 2B (C.I. #22610)
Suminol Fast Sky Blue B (C.I. #62105)
Sumitomo Brilliant Blue 5G (C.I. #42120)
Rhodamine B (C.I. #45170)
Microlith Yellow 4G-A (a product of Ciba-Geigy Co.)
Microlith Yellow 2R-A (a product of Ciba-Geigy Co.)
Microlith Red 22396-A (a product of Ciba-Geigy Co.)
Microlith Blue 5G-A (a product of Ciba-Geigy Co.)

The light-sensitive photoresist layer used in the present invention should be constructed so that this layer is developable with an aqueous developing solution after imagewise exposure whereby only either of the unexposed or exposed area is selectively dissolved or swollen by the aqueous developing solution, described hereinafter, and removed.

Suitable examples of materials for forming the light-sensitive photoresist layer include a diazonium salt-/paraformaldehyde condensate as disclosed in Japanese Patent Publication No. 11365/63, U.S. Pat. Nos. 2,679,498 and 1,762,033, or in A. R. Materazzi, *TAGA Proceedings*, pp. 241-244 (1967), o-quinonediazides (or o-diazoxide compounds) as disclosed in Japanese Patent Publication Nos. 3627/62, 28403/68 (corresponding to U.S. Pat. No. 3,635,709) and 9610/70, alkali-soluble azide polymers as set forth in Japanese Patent Publication Nos. 28499/65 and 22085/70 (corresponding to U.S. Pat. No. 3,475,176), British Pat. No. 843,541, etc., azide compounds, developable with water or an alkaline aqueous developer, set forth in Japanese Patent Publication Nos. 7100/66, 28725/69 and 22082/70 and U.S. Pat. No. 2,692,826, photopolymerizable acrylamide derivatives as described in F. W. H. Mueller, H. Evans and E. Cerwonka, *Photographic Science & Engineering*, Vol. 6, p. 227 (1962), photopolymerizable compositions containing diacrylate derivatives as set forth in Japanese Patent Publication Nos. 342/60, 8495/60, 14065/60, 16614/60, 4112/61, 16078/61, 1306/62 (corresponding to U.S. Pat. No. 3,157,505), 14657/62 (corresponding to U.S. Pat. No. 3,012,952), 15810/63, 1112/64, 2204/65 (corresponding to U.S. Pat. Nos. 3,264,103 and 3,395,014) and 12104/65 (corresponding to U.S. Pat. No. 3,186,844), photopolymerizable compositions containing acrylic acid esters of pentaerythritol as disclosed in Japanese Patent Publication No. 32714/71 (corresponding to U.S. Pat. Nos. 3,475,174 and 3,458,311), photopolymerizable compositions containing methacrylates as set forth in Japanese Patent Publication No. 42450/71, photopolymerizable compositions which contain polymers having a carboxylic group in side chain thereof in combination with a double bond as set forth in Japanese Patent Application (OPI) No. 58106/76 (corresponding to U.S. Application Ser. No. 632,593, filed Nov. 17, 1975), poly(methacrylic acid) containing photopolymerizable compositions, i.e., a light-sensitive photopolymerizable composition containing an ethylenically unsaturated compound, a photopolymerization initiator, and an organic copolymer binder having water-solubilizing groups in the side chains which copolymer contains a repeating unit derived from acrylic or methacrylic acid, and a repeating unit derived from benzyl acrylate, benzyl methacrylate or the like, disclosed in Japanese Patent Application (OPI) No. 23632/77 or Japanese Patent Application (OPI) No. 99810/77 (corresponding to U.S. Application Ser. No. 767,865, filed Feb. 11, 1977, U.S. Pat. No. 4,139,391), photocrosslinkable light-sensitive resin compositions comprising a polymer bearing an amino group substituted with aromatic groups and a compound having a polyhalogenated methyl group, and still other light-sensitive resin compositions described in J. Kosar, *Light-Sensitive Systems*, John Wiley & Sons, Inc., New York (1965), T. Tsunoda, *Kankosei Jyushi* (*Photosensitive Polymers*), Printing Society of Japan, Publishing Division (1972), *Photopolymers: Principles, Processes and Materials*, Regional Technical Conference of Society of Plastics Engineers, Inc., Ellenville, N.Y. (1973) and (1976), M. G. Halpern, *Plastic Printing Plate Manufacture and Technology*, Noyes Data Corp., Park Ridge, N.J. (1971), W. S. Deforest, *Photoresist: Materials and Processes*, McGraw-Hill Book Co., New York (1975), etc.

Of these materials, only the o-quinonediazides are processed as a positive-working type and other materials are processed as a negative-working type.

The thickness of the light-sensitive photoresist layer is in the range of from about 1 to 30 μm, preferably 2 to 10 μm.

As aqueous alkaline developers capable of development etching in one bath the light-sensitive photoresist layer and the layer containing the alcohol-soluble polyamide as a necessary ingredient, there can be used an aqueous solution of alkali agent such as sodium hydroxide, potassium hydroxide, sodium tertiary phosphate, potassium tertiary phosphate, sodium carbonate, potassium carbonate, sodium silicate, potassium silicate and the like. The aqueous alkaline developer desirably has a pH of 10 to 14, preferably 11 to 13.5. In some cases, organic solvents may be added thereto. Examples of solvents used include water, aqueous alkali solutions which may contain organic solvents, and organic solvents per se. Examples of organic solvents which can be used include ketones such as methyl ethyl ketone, cellosolves such as methyl cellosolve, ethyl cellosolve, methyl cellosolve acetate, ethyl cellosolve acetate and phenyl cellosolve acetate, and alcohols such as methanol, ethanol and benzyl alcohol, but it is not construed to be limited to these specific examples.

The present invention will now be illustrated in more detail by the following non-limitative examples of the present invention.

EXAMPLE 1

The following composition was coated in a dry thickness of 6 μm on a 100 μm thick, biaxially oriented, colorless (transparent) polyethylene terephthalate (PET) film.

|  | parts by weight |
|---|---|
| Alcohol-soluble polyamide (Ultramid 1C; a product for a polycondensate containing as major components caprolactam, hexamethylenediamine/adipic acid and p,p'-diaminodicyclohexylmethane/adipic acid, made by BASF) | 1.6 |
| Hydroxypropyl-methyl cellulose hexahydrophthalate (trade name; FA-11; made by Sin-etsu Chemical Industry Co., Ltd.) | 0.4 |
| CI Solvent Red 8 | 0.3 |
| CI Solvent Yellow 19 | 0.3 |
| Methanol | 20 |
| Methyl cellosolve | 4 |

The following composition was coated in a dry thickness of 2.5 μm on the thus-formed layer (colored nylon layer) containing an alcohol-soluble polyamide as a major component to form a light-sensitive photoresist layer (light-sensitive layer).

|  | parts by weight |
|---|---|
| Adduct of acetone-pyrogallol condensate (mean polycondensation degree: 3 to 5) and 2-diazo-1-naphthol-4-sulfonyl chloride, prepared in accordance with the method of Example 1 in U.S. Pat. No. 3,635,709 | 1 |
| Novolak phenol resin (mean polymerization degree: 5) | 2 |
| Methyl ethyl ketone | 20 |
| Methyl cellosolve acetate | 10 |

The thus-obtained light-sensitive image-forming material was imagewise exposed for 30 seconds using a Jet Printer 2000 (made by Orc Manufacturing Co., Ltd.; containing a 2 kw superhigh pressure mercury lamp; exposure distance of 50 cm) and then immersed in the following solution at 31° C. for 40 minutes to develop and etch the same.

| Sodium hydroxide | 4 g |
|---|---|
| Sodium tertiary phosphate (12 hydrate) | 10 g |
| Water | 1 l |

Exposed portions of the light-sensitive layer and the colored nylon layer lying thereunder were removed, whereas unexposed portions of the light-sensitive layer and the colored nylon layer portions lying thereunder remained, a positive image with respect to the original thus being formed. The image was usable as a negative mask for a light-sensitive material sensitive to near-ultraviolet light to visible light of about a 300 to about 600 nm wavelength.

A near-ultraviolet ray-absorbing opaque red lacquer was then applied to the non-image portions of the support having the thus-formed image thereon and the product was dried.

A pin (needle) was inserted into the delaminatable layer at one end of the negative image portions to roll up the layer, a continuous image thus being delaminated at the boundary between the colored nylon layer and the support to remove the image portion whereby the opaque red lacquer layer was left on the support to form a positive image with respect to the original.

COMPARATIVE EXAMPLE 1

The procedure described in Example 1 was followed except for coating the following composition in a dry thickness of 6 μm as a substitute for the colored nylon layer.

|  | parts by weight |
| --- | --- |
| Alcohol-soluble polyamide (Ultramid 1C) | 2 |
| CI Solvent Red 8 | 0.3 |
| CI Solvent Yellow 19 | 0.3 |
| Methanol | 20 |
| Methyl cellosolve | 4 |

When the material was developed following the procedure of Example 1 after imagewise exposure, only exposed portions of the light-sensitive layer were developed (removed) and the alcohol-soluble polyamide layer portions lying thereunder were not removed.

EXAMPLE 2

Following the procedure of Example 1 except for using poly-p-hydroxystyrene (Resin M having a mean molecular weight of 3,000 to 12,000 and a softening point of 160° to 200° C.; made by Maruzen Oil Company, Ltd.) in place of hydroxypropyl-methyl cellulose hexahydrophthalate in the colored nylon layer and developing for 70 seconds, the same results were obtained.

EXAMPLE 3

Following the procedure of Example 1 except for using a styrene/maleic acid anhydride copolymer (molar ratio of styrene/maleic acid anhydride: 5/5; mean molecular weight: 5,000) in place of hydroxypropyl-methyl cellulose hexahydrophthalate and developing for 50 seconds, the same results were obtained.

While the invention has been described in detail and with reference to specific embodiments thereof, it will be apparent to one skilled in the art that various changes and modifications can be made therein without departing from the spirit and scope thereof.

What is claimed is:

1. A light-sensitive image-forming material which comprises a support having provided thereon a first layer consisting essentially of at least one alcohol-soluble polyamide resin and, on said first layer, a second layer comprising a light-sensitive photoresist composition, said layer containing said alcohol-soluble polyamide resin and further consisting essentially of one or more polymers having one or more of a free carboxy group(s), one or more of a phenolic hydroxy group(s) or a maleic anhydride group in a proportion of about 0.1:9.9 to 6:4 by weight to said polyamide resin, wherein said light-sensitive layer and said alcohol-soluble polyamide resin layer are capable of being simultaneously developed and etched in an alkaline aqueous developer, whereby only either unexposed or exposed areas are selectively dissolved or swollen by the aqueous developing solution and removed.

2. The light-sensitive image-forming material of claim 1, wherein said alcohol-soluble polyamide is selected from the group consisting of nylon 6/66/610 (terpolycondensate), ε-caprolactam/hexamethylenediamine/adipic acid/bis(4-aminocyclohexyl)-methane quaternary polycondensate, a polycondensate composed mainly of caprolactam, hexamethylenediamine/adipic acid and p,p'-diaminodicyclohexylmethane/adipic acid, N-methoxymethyl nylon and N-ethoxymethyl nylon.

3. The light-sensitive image-forming material of claim 1, wherein said alcohol-soluble polyamide resin is a nylon soluble in methanol at 25° C. in an amount greater than 0.1% by weight.

4. The light-sensitive image-forming material of claim 1, wherein said one or more polymers having one or more of a free carboxyl group(s), one or more of a phenolic hydroxy group(s) or a maleic anhydride group is selected from the group consisting of (meth)acrylic acid/alkyl(meth)acrylate copolymers, copolymers of (meth)acrylic acid and benzylmethacrylate wherein (meth)acrylic acid means acrylic acid or methacrylic acid, hydroxypropyl-methyl cellulose hexahydrophthalate, hydroxymethyl-methyl cellulose phthalate, halogenated polhydroxy styrene, styrene/maleic anhydride copolymers, (meth)acrylic acid/styrene copolymers and (meth)acrylic acid/hydroxyalkyl(meth)acrylate copolymers.

5. The light-sensitive image-forming material of claim 4, wherein said one or more polymers are incorporated in the alcohol-soluble polyamide resin layer in a proportion of about 0.1:9.9 to 7:3 by weight to the alcohol-soluble polyamide.

6. The light-sensitive image-forming material of claim 1, wherein said alkaline aqueous developer has a pH of 10 to 14.

* * * * *